US012613274B2

(12) United States Patent
Giacomini et al.

(10) Patent No.: US 12,613,274 B2
(45) Date of Patent: Apr. 28, 2026

(54) CRACK DETECTOR FOR SEMICONDUCTOR DIES

(71) Applicants: STMICROELECTRONICS S.r.l., Agrate Brianza (IT); STMicroelectronics International N.V., Geneva (CH)

(72) Inventors: Mauro Giacomini, Bergamo (IT); Fabio Enrico Carlo Disegni, Spino d'adda (IT); Rajesh Narwal, Greater Noida (IN); Pravesh Kumar Saini, Greater Noida (IN); Mayankkumar Hareshbhai Niranjani, Lathi (IN)

(73) Assignees: STMICROELECTRONICS S.r.l., Agrate Brianza (IT); STMicroelectronics International N.V., Geneva (CH)

( * ) Notice: Subject to any disclaimer, the term of this patent is extended or adjusted under 35 U.S.C. 154(b) by 589 days.

(21) Appl. No.: 18/053,688

(22) Filed: Nov. 8, 2022

(65) Prior Publication Data

US 2023/0168300 A1     Jun. 1, 2023

(30) Foreign Application Priority Data

Dec. 1, 2021     (IT) ........................ 102021000030482

(51) Int. Cl.
*G01R 31/315* (2006.01)
*H01L 21/66* (2006.01)

(52) U.S. Cl.
CPC ............ *G01R 31/315* (2013.01); *H01L 22/12* (2013.01)

(58) Field of Classification Search
CPC .............................. G01R 31/315; H01L 22/12
(Continued)

(56) References Cited

U.S. PATENT DOCUMENTS 6,420,883 B1 *  7/2002  Watanabe ............ H10D 84/209
                                                   324/537
2001/0022745 A1 *  9/2001  Lee .......................... H03L 7/00
                                                   365/194

(Continued)

FOREIGN PATENT DOCUMENTS

DE      102004028695 B3    12/2005

OTHER PUBLICATIONS

"Internal application note: Crack detector deployment," ST Reference DM00747268, Nov. 1, 2020. (3 pages).

*Primary Examiner* — Alesa Allgood
*Assistant Examiner* — Rahul Maini
(74) *Attorney, Agent, or Firm* — Seed Intellectual Property Law Group LLP

(57) ABSTRACT

An assembly for detecting a structural defect in a semiconductor die is provided. The assembly includes a defect-detection sensor and a microcontroller. The defect-detection sensor includes a plurality of resistive paths of electrical-conductive material in the semiconductor die, each of which has a first end and a second end and extends proximate a perimeter of the semiconductor die. The defect-detection sensor includes a plurality of signal-generation structures, each coupled to a respective resistive path and configured to supply a test signal to the resistive path. The microcontroller is configured to control the signal-generation structures to generate the test signals, acquire the test signals in each resistive paths, test an electrical feature of the resistive paths by performing an analysis of the test signals acquired and detect the presence of the structural defect in the semiconductor die based on a result of the analysis of the test signals acquired.

19 Claims, 11 Drawing Sheets

(58) Field of Classification Search
USPC ..................................................... 324/754.29
See application file for complete search history.

(56) References Cited

U.S. PATENT DOCUMENTS

| | | | |
|---|---|---|---|
| 2007/0001682 A1* | 1/2007 | Habitz ............... | G01R 31/3016 |
| | | | 324/500 |
| 2009/0058435 A1* | 3/2009 | Nakamura ............. | G01R 31/71 |
| | | | 324/719 |
| 2009/0321734 A1 | 12/2009 | Ogawa et al. | |
| 2010/0184287 A1 | 7/2010 | Eom | |
| 2012/0056639 A1* | 3/2012 | Oomura ................ | H01L 23/576 |
| | | | 324/762.03 |
| 2014/0049284 A1 | 2/2014 | Pak et al. | |
| 2014/0375341 A1 | 12/2014 | Fender et al. | |
| 2015/0115266 A1 | 4/2015 | Sanchez et al. | |
| 2021/0356514 A1* | 11/2021 | Polomoff ........... | G01R 31/2884 |
| 2021/0366794 A1* | 11/2021 | Chen ................... | G01R 31/2831 |
| 2022/0293532 A1* | 9/2022 | Lee ......................... | H01L 22/34 |

* cited by examiner

CRACK DETECTOR FOR SEMICONDUCTOR DIES

BACKGROUND

Technical Field

The present disclosure relates to an assembly for detecting a structural defect in a semiconductor die.

Description of the Related Art

Wafer singulation process for dice is a sensitive manufacturing step (specifically for LowK and ultra-LowK technologies). To secure this process, it is possible to detect failures linked to chipping and cracks in the seal ring of the dice (during the "Back-end-Of-Line," BEOL, manufacturing phase), using a so-called crack detector.

With reference to FIG. 1, a die 10 is shown in a top-plan view, and includes a crack sensor, or detector, 1. The crack sensor 1 is, in one exemplary embodiment of the known art, formed by several elements:

a conductive line 2 (having a resistance), arranged either in a seal ring area 4 of the die 10 or in between the seal ring 4 and a sawing street 6;

a detector cell 8, arranged in a I/O ring 7 of the die 10; and a test logic (e.g., test circuit) 9, embedded in a core portion 5 of the die 10, configured to test the resistive sensor 1 using the detector cell 8.

The conductive line 2 is substantially a continuous strip of conductive material, having a certain resistance, extending between two electrical nodes E1, E2. The conductive line 2 can be formed by one or two sub-lines; in case of two sub-lines, one sub-line is placed between the seal ring area 4 and the I/O ring 7, and is also known as "inner sensor," and the other sub-line is placed within the seal ring area 4 and is also known as "outer sensor." Each sub-line is realized as a via chain (see FIG. 2). This solution with two sub-lines, or sub-sensors, permits to detect, in addition to cracks, also delamination defects. Considering the outer sensor, N-well straps may be inserted in the sensors terminals in order not to "break" the metal continuity of the seal ring area 4.

Measuring the electrical continuity of the sensor 1 during EWS (Electrical Wafer Sorting") and FT ("Final Test") through the detector cell 8 allows to detect, and screen out, portions of the seal ring having cracks. Affecting a specific bin and SBL to this test will allow a correct monitoring of the defect rate and to take adequate actions in case of need.

The use of the sensor 1 improves the robustness of the chip product, enables detection of cracks in the BEOL at "time zero," which prevents delivery of weak parts that become failed parts in the customer application (when thermomechanical or humidity constraints play a major role). Use of sensor 1 has a negligible impact on test time (it requires to test of a simple resistor), and does not introduce disturbances of functionality for RF products.

FIG. 2, as anticipated, shows a cross-sectional view of an embodiment of (a portion of) a crack sensor 1 according to the known art. The crack sensor 1 of FIG. 2 may be used for chips with an interconnect structure of more than two metal layers. Substrate conductive segments 11 are arranged in a substrate 12. A first portion of the substrate conductive segment 11 is connected to a first conductive segment 14 in the M1 metallization level. A second portion of the substrate conductive segment 11 is connected to a second conductive segment 15 in the M1 metallization level. The first conductive segment 14 is connected to a plurality of further conductive segments 16 in upper metallization levels through a plurality of interlayer connects. Analogously, the second conductive segment 15 is connected to a plurality of further conductive segments 18 in upper metallization levels through a plurality of respective interlayer connects.

The interlayer connects may comprise contacts and/or plugs/vias.

The structure of FIGS. 1 and 2 may be used to detect cracks that may form when the dies 10 are separated (singulated) from the wafer. As said, the crack detector is a resistive sensor composed of a metal wire with two electrical nodes. This metal wire is placed around the die close to seal ring. Measuring the continuity of this wire allows to detect cracks.

To test the die 10 for cracks a voltage is applied across the electrical nodes E1, E2. A current flows during the application of the voltage to the two nodes E1, E2. If there is no (or almost no) voltage drop over the resistive line 2, the sensor is intact and a crack is not disrupted or broken. If there is some voltage drop over the resistive line 2, the sensor may partially be broken, and if there is a complete or almost complete voltage drop over the resistive line 2, the sensor may be cut or severely damaged.

Some limitations apply to this solution. In particular, a large dispersion of sensor resistance, due to process variations, may be present, and therefore it is difficult to set reliable limits; moreover, the test requires long time to be completed (around 10 ms); furthermore, the measurement requires off-chip arrangement.

As an alternative solution, a digital testing can also be carried out.

FIG. 3 shows a circuit design for performing digital testing.

In this example, a digital signal DATAIN is set as input to electrical node E1 of the crack sensor 1. Signal DATAIN goes from digital value "0" to digital value "1." An input buffer stage 20 is provided to receive the signal DATAIN, rectify the signal DATAIN and drive properly the crack sensor 1 through node E1. An output buffer stage 21 is provided coupled to output electrical node E2 of the crack sensor 1, to receive the signal that propagates through the crack sensor 1, rectify the signal and provide at output a digital signal SOUT.

In one possible implementation, the signal DATAIN is generated by the test logic 9, and the input buffer stage 20 is part of the detector cell 8, analogously, the signal SOUT is received by the test logic 9 and the output buffer stage 21 is part of the detector cell 8.

In case no cracks are present (i.e., the resistive line 2 is not interrupted by a crack), the signal SOUT corresponds to the signal DATAIN, and is received with a certain time delay. On the contrary, in case of interruptions of the resistive line 2, no signal SOUT is received, or the signal SOUT considerably differs from the signal DATAIN. A crack, or another issue along the resistive line 2, is thus revealed.

Some limitations emerge from the use of the solution of FIG. 3.

In particular, the users experience a large dispersion of sensor's RC constant (due to manufacturing process variations), therefore it would be difficult to set reliable limits; moreover, it is difficult to measure the exact transition time (since a sampling window should be fixed). Furthermore, this measurement requires off-chip arrangement.

BRIEF SUMMARY

An assembly for detecting a structural defect in a semiconductor die is provided.

BRIEF DESCRIPTION OF THE SEVERAL VIEWS OF THE DRAWINGS

For a better understanding, preferred embodiments thereof are now described, purely by way of non-limiting example and with reference to the attached drawings, wherein.

DETAILED DESCRIPTION

Figure 4:
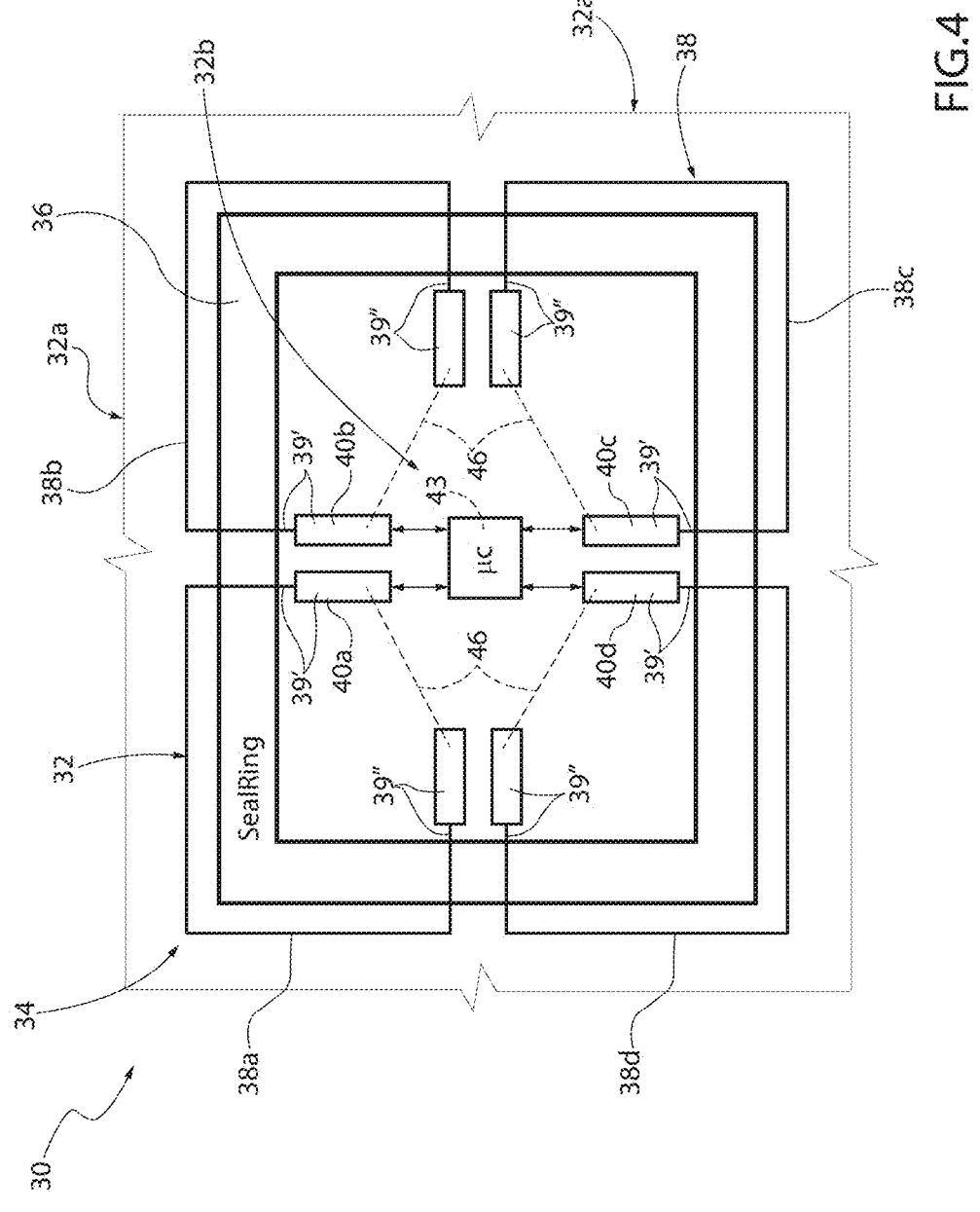
FIG. 4 is a top view of a semiconductor die including a crack detector according to an embodiment.

FIG. 4 shows a die 30 housing a crack-detection sensor 32 (in the following also referred to as "crack sensor"), according to an embodiment.

In a way not shown in the drawings, the die 30 derives from a semiconductor wafer comprising a plurality of dies 30 formed across a top surface of the wafer, after the semiconductor dies have been diced (i.e., cut into individual dies from a wafer). The die 30 is typically square or rectangular in shape. The die 30 comprises an integrated circuit (not shown in detail).

After manufacturing of a plurality of dies on the wafer, the plurality of dies are separated from one another along scribe lines (the so-called "singulation" step). The scribe lines are located at the perimeter of the die 30, so that at the end of the manufacturing process a saw can be used to detach one die from adjacent dies along the scribe lines. The singulation of the dies may also be performed, for example, by laser dicing or laser scribing followed by saw dicing.

The crack sensor 32 is formed in at least one conductive-material layer (metal layer) of the die 30, more preferably in a plurality of overlying metal layers separated from one another by dielectric or insulating layers and connected by means of vias passing through such dielectric or insulating layers. The crack sensor 32 is, in particular, formed at least in part along a perimeter region 34 of the die 30, as shown in FIG. 4. In detail, the crack sensor 32 is formed between an edge 32a of the die 32 and an interior region 32b of the die 32, wherein the interior region 32b houses the integrated circuit. In one embodiment, a seal region, or seal ring, 36 is also present between the edge 32a and the interior region 32b. A seal ring is, for example, a multi-layer structure composed of alternating conducting and insulating layers. Through each of the insulating layers run multiple vias which provide electrical paths between adjacent metal layers. The lowest layer of metal in the seal structure makes electrical contact with the substrate, which can be either p-type or n-type. The seal ring 36 may be omitted.

Figure 1:
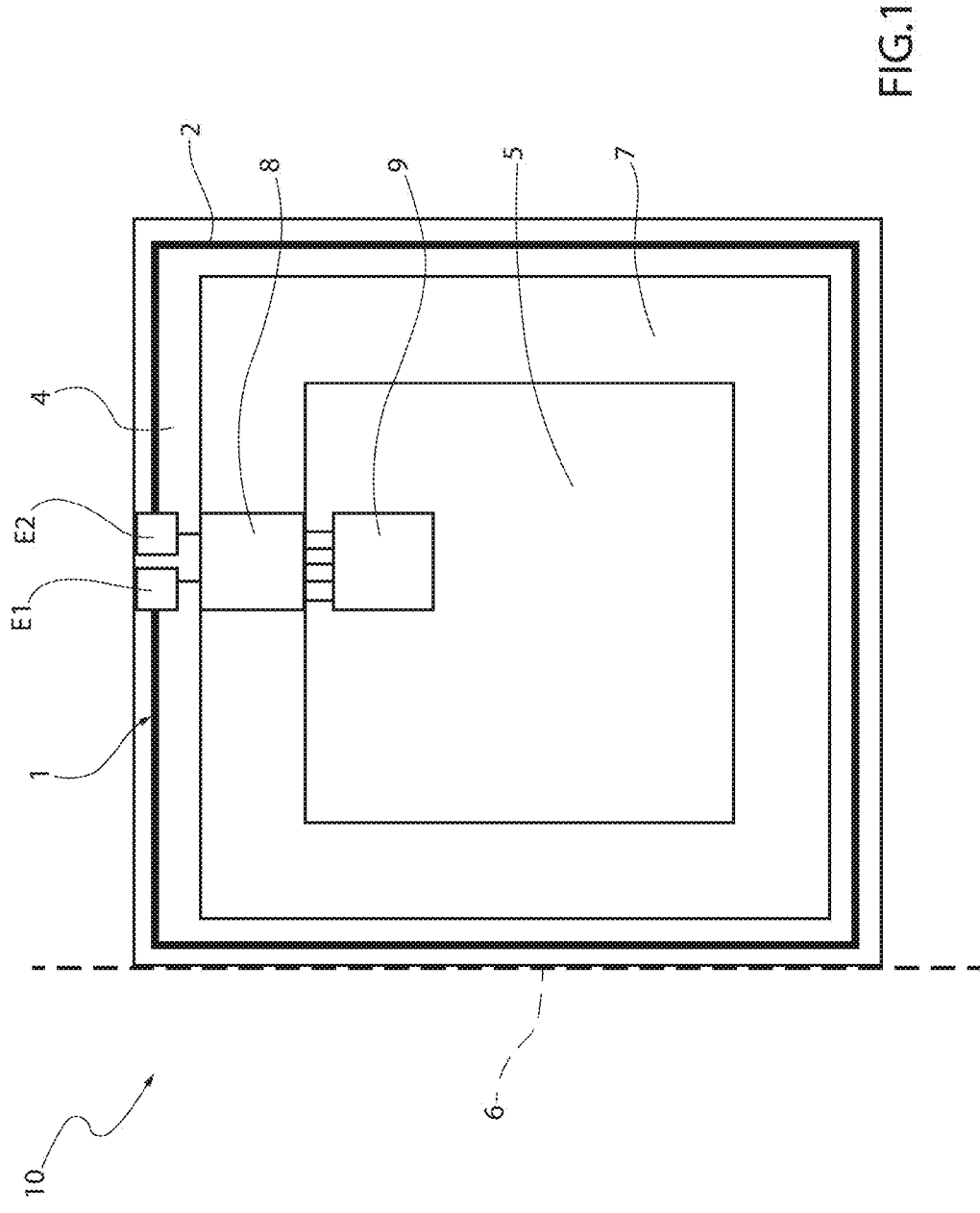
FIG. 1 is a top view of a semiconductor die including a crack detector according to the known art.
Figure 2:
FIG. 2 is a section view of a crack detector according to the known art, from which it can be appreciated that the crack detector is formed in a plurality of metal layers and vias.
Figure 3:
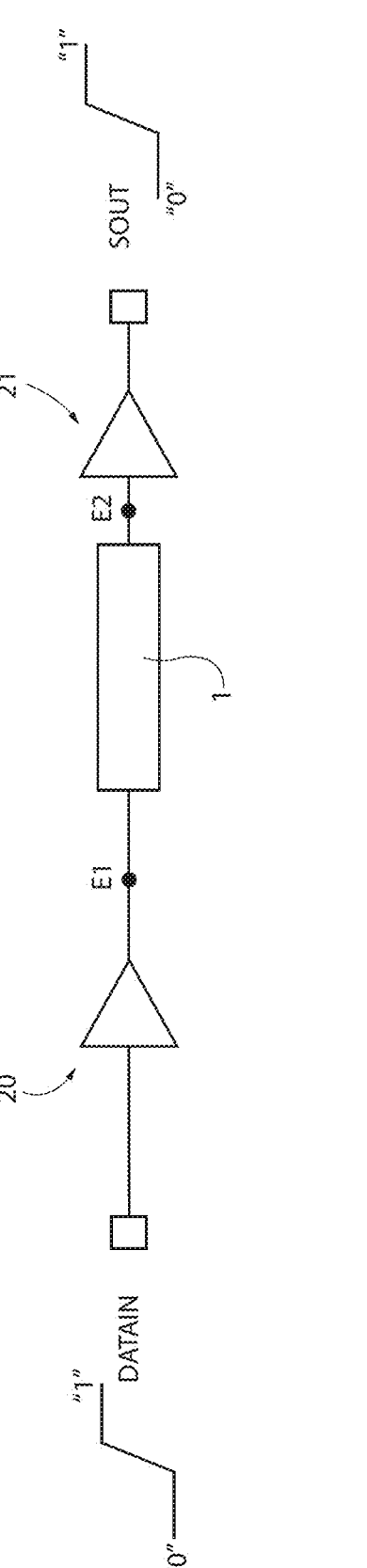
FIG. 3 shows a circuit to perform digital measures of the crack detector, according to the known art.

The crack sensor 32 comprises a resistive structure 38 of conductive material (in the following also named "conductive structure") which extends, or is integrated, proximate the edge 32a, at least in part between (in a top view) the seal ring 36 and the edge 32a. The conductive structure 38 comprises a plurality of resistive segments 38a-38d of conductive material (in the following, also named "conductive segments"), formed in one or more metal layers of the die 30; in other words, the conductive structure is formed in a plurality of metal layers in a multi-level interconnect system, wherein vias are used to connect one metal level to another (analogously to the prior art shown in FIG. 2). Each conductive segment 38a-d comprises a first end 39' and a second end 39".

While the conductive segments 38a-d extends mainly along the edge 32a, the first end 39' and the second end 39" are in the interior region 32b (therefore, at least a portion of the conductive segments 38a-d extends from the edge 32a to the interior region 32b, or vice-versa, through the seal ring 36). The first end 39' and the second end 39" of each conductive segment 38a-d are coupled to respective end portions of a respective oscillator module (e.g., oscillator) 40a-40d; each oscillator module 40a-40d includes elements (in particular, in one embodiment, passive electronic devices) configured for generating an oscillating signals, having an own frequency, throughout the conductive segment 38a-d. The frequency of the oscillating signals can be used for checking the structural integrity of the die 30. In fact, the frequencies of the oscillating signals in each conductive segment 38a-38d, can be measured and compared with a reference frequency (pre-set value), or compared with one another. In case of comparison with a reference frequency, the result of the comparison is indicative of the presence of a defect. In case of comparison of one frequency with another frequency (belonging to different segments 38a-38d), the result of the comparison is indicative of the presence of a defect.

A microcontroller 43 is present to perform operations aimed at verifying the presence of the structural defect, as better discussed later. The microcontroller 43 can be integrated in the semiconductor die 30 (in the region 32b), or arranged external to the semiconductor die 30. The microcontroller 43 is operatively coupled to the oscillator modules 40a-40d.

In detail, if the frequency in one conductive segment 38a-38d is different from the reference frequency (expected frequency), a structural defect is probably present at the region of the die 30 housing such conductive segment. The detection can be carried out by comparing, by the microcontroller 43, the frequency of the oscillating signal in the conductive segment 38a-38d under test with an expected frequency value (predefined, stored in a memory). Tolerances can be set when performing such frequency comparison.

When the frequency of a signal in one conductive segment 38a-38d is compared with the frequencies of the signals in the other conductive segments 38a-38d, a structural defect is detected when the frequencies are not equal or substantially equal to one another. In this case, a differential measurement is performed. For example, the two frequencies belonging to two respective conductive segments 38a-38d are subtracted, and the result (the difference) is checked with respect to a predefined range of expected values. In particular, if the difference is greater that a threshold, the two frequencies are deemed to be different from one another and a defect in the die 30 is detected.

Also in this case, tolerances can be set when performing such frequency comparison. The detection can be carried out by comparing, by the microcontroller 43, the frequency of the oscillating signal in the conductive segment 38a-38d under test with the frequency of the oscillating signal in one or more of the other conductive segments 38a-38d. In this latter case, the defect is detected if the measured frequency for the conductive segment under test is substantially different from the frequency measured in the other conductive segments 38b-38d. In principle, it is not important to know which frequency is "correct," i.e., that of the segment under test or that of the other segment(s). In fact, as long as a defect is detected, the entire die 30 is to be put aside/replaced.

Absence of the oscillating signal is also an indication of the presence of a structural defect.

With specific reference to the embodiment of FIG. 4, four oscillator modules 40a-40d are arranged within region 32b. With the present solution, using four conductive segments 38a-d instead of a single conductive segment (as in the known art), and performing separate frequency measurements for each of them, provide a precise indication of the possible defectivity (associated to a crack or delamination of the respective portion of the die 30) of the die 30 under test.

The approach that foresees reciprocal comparison of the frequencies of the signals in the segments 38a-38d requires that all conductive segments 38a-38d and oscillator modules 40a, 40b are structurally equivalent so that, in normal conditions (absence of defects) all the frequencies have the same value, or approximately the same value when normal variations are taken into consideration by the microcontroller 43 performing the comparisons. The detection of the issue (crack, leakage, etc.) is, in this approach, not dependent on absolute parameters, but depends on a relative error detected in one conductive segment 38a-38d with respect to the measurements done in the other conductive segments 38a-38d.

In an alternative embodiment, the absolute range of the measured parameter across PVT can anyway also be checked.

Figure 5:
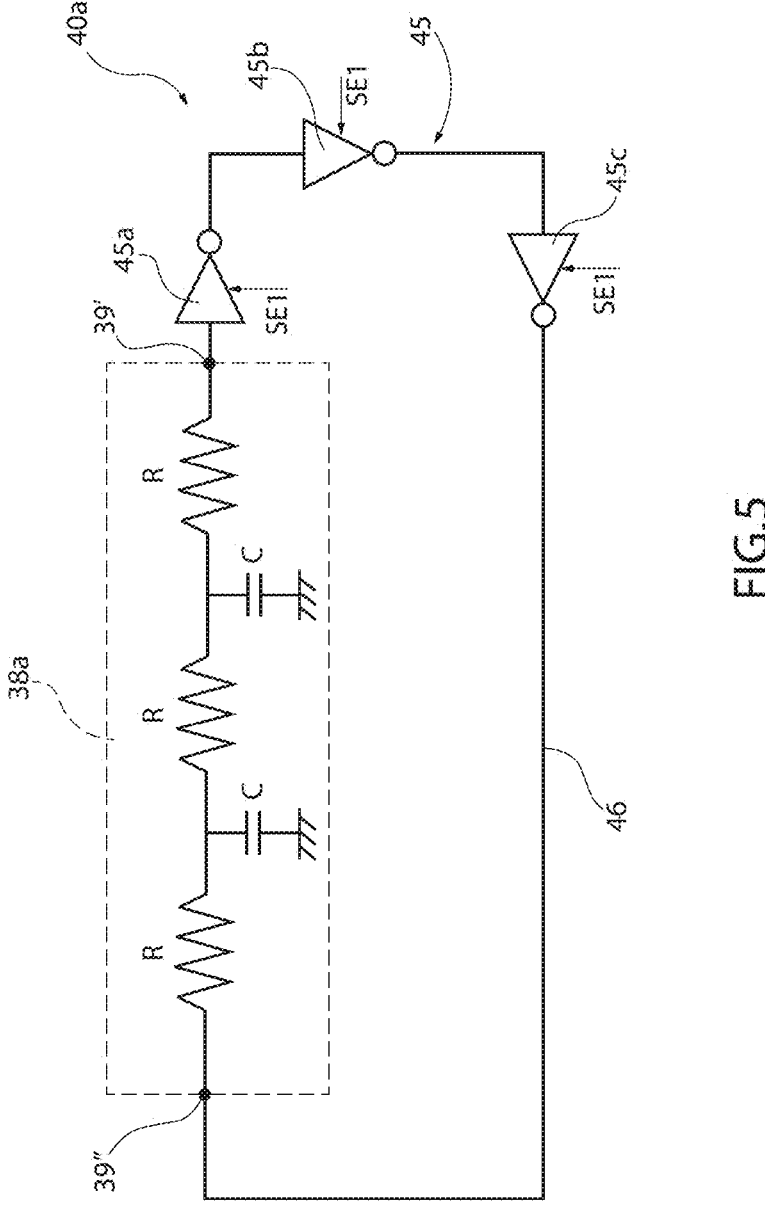
FIG. 5 schematically shows an electrical representation of a portion of a crack detector provided with a mono-directional oscillating ring, according to an embodiment.

With reference to FIG. 5, the conductive segment 38a and the oscillator module 40a coupled to it are shown in details, according to one embodiment.

Figure 7B:
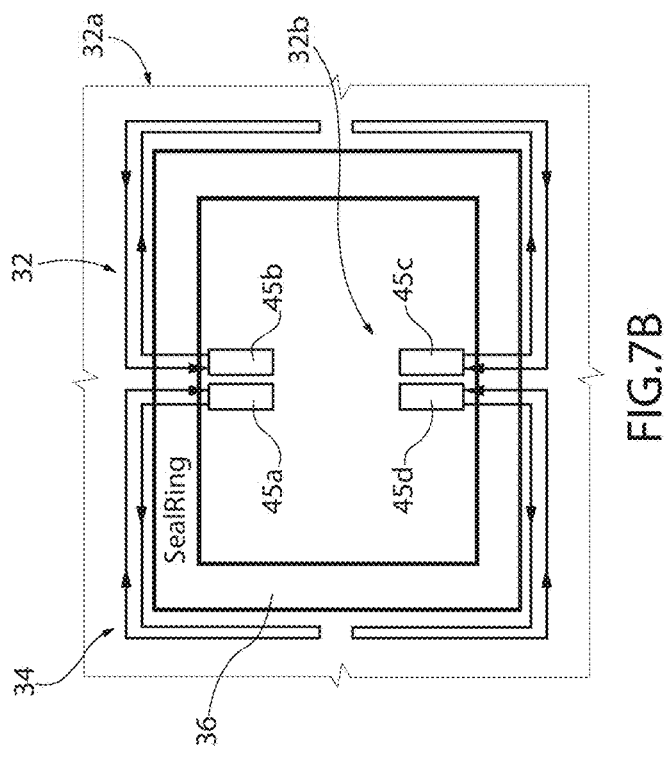
FIG. 7B is a top view of the semiconductor die including the crack detector according to the embodiment of FIG. 7A.

In the embodiment of FIG. 5, the detection is performed by looping each conductive segment 38a-38d (here, as said, only segment 38a is shown as an example) as an oscillating structure employing passive elements only. The oscillator module 40a (oscillator modules 40b-40d are analogous)

includes a chain (e.g., stage) 45 formed by the series of an odd number of NOT gates or inverters 45a, 45b, 45c (for example, three inverters). Each inverter has an input port, an output port and a control port adapted to receive an enabling signal (or control signal) SE1 that turns "on" and "off" the respective inverter. The inverters are connected in series to one another so that the output port of one inverter is coupled to the input port of the other inverter in the series connection. In particular, the input port of inverter 45a is connected to the first end 39' of segment 38a; the output port of inverter 45a is connected to input port of inverter 45b; output port of inverter 45b is connected to input port of inverter 45c; and output port of inverter 45c is connected to second end 39" of segment 38a. the connection of the output port of inverter 45c to the second end 39" is formed by a conductive line 46 that runs through the region 32b of the die 30 (as depicted schematically in FIG. 4 with dashed line) or, alternatively, along the periphery of the die 30, analogously to segment 38a (see FIG. 7B).

The conductive segment 38 is schematically depicted as a RC electrical structure.

By connecting the chain 45 to both ends 39', 39" of the conductive segment 38a, thus forming a closed loop, a ring oscillator is formed. A frequency signal is therefore generated and can be detected by the microcontroller 43. The ring oscillator in this example comprises three tri-state inverters in a ring, whose output oscillates between two voltage levels, representing "true" and "false" logic states. The enabling signal SE1 is used to activate and deactivate the oscillator module 40a, when requested during use. For example, when SE="1," the inverters are "on" (or "active" or in "conduction state"), and the oscillator module 40a starts oscillating and a frequency can be observed at any point in the loop; such frequency can be measured through known devices and techniques.

For example, the microcontroller 43 is coupled to the inverters 45a-c in the chain 45 to provide the activation signal SE1 only when a test is to be performed, and deactivate the inverters otherwise.

There can be multiple methods to measure the frequency in the loop. In one exemplary embodiment, the analysis of the frequency can be done by acquiring, by the microcontroller 43, the signal in the ring oscillator (e.g., the signal present at the output port of anyone of the inverters in the chain 45) and counting the rising edges of such signal. To measure the frequency, other parameters of the signal can be checked by the microcontroller 43 (for examples the falling edge of the signal, or the logic states "0" or "1" of the signal). The frequency thus measured can, as already discussed, be compared with a pre-set value (e.g., stored in a memory) or compared with the measured frequencies of the signal in one or more of the other conductive segments 38b-38d/chains 45.

The circuit shown is capable to finely measure, during testing, the frequency and therefore the effective RC. Fine measures provide the capability of correlation between:
  Native measure at EWS;
  Values measured at FT (being sawing major source of
    cracks);
  Hard failures after stress (Burn-In, soldering, thermal
    cycles) characterization;
  Hard failures from the field.

The RC constant of the conductive segment is dominant with respect to CMOS elements (i.e., the inverters of the chain 45), therefore allowing a frequency measure that is substantially immune from undesired contributions.

Figure 6:
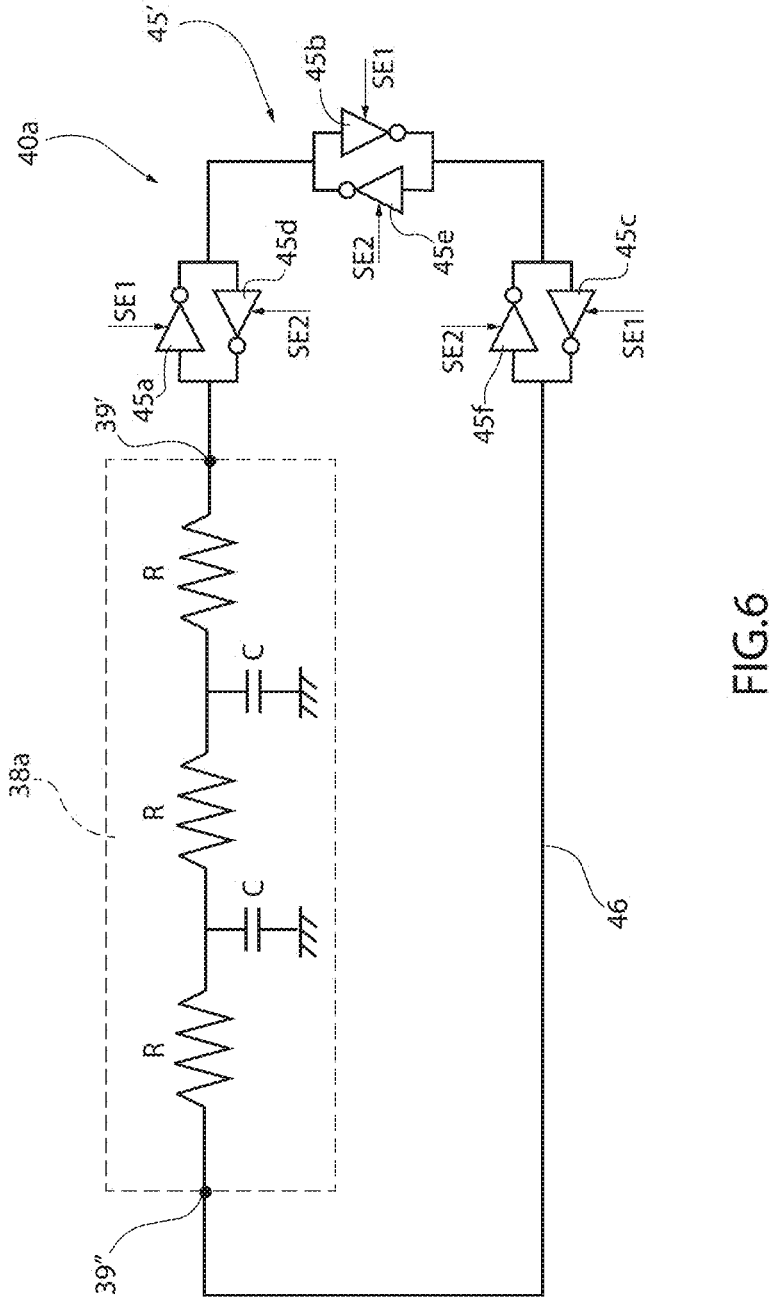
FIG. 6 schematically shows an electrical representation of a portion of a crack detector provided with a bi-directional oscillating ring, according to a further embodiment.

FIG. 6 shows a further embodiment of one oscillator module (here, for example oscillator module 40*a*, but the other oscillator modules 40*b*-40*d* are the same), where a bidirectional oscillating structure 45' is employed and implemented. Here, each inverter 45*a*-45*c* in the chain is arranged in electrical parallel with another inverter 45*d*-45*f*, to allow the generation of an oscillating signal in both clockwise and counter clockwise directions. When a signal in clockwise direction is to be generated, the corresponding inverters 45*a*-45*c* are turned on by setting signal SE1="1," and the other inverters 45*d*-45*f* are turned off by setting signal SE2="0." When a signal in counter clockwise direction is to be generated, the corresponding inverters 45*d*-45*f* are turned on by setting signal SE2="1," and the other inverters 45*a*-45*c* are turned off by setting signal SE1="0."

In this embodiment, the effect of an abnormal resistance of a portion of the conductive segment 38*a* (due to, e.g., a crack or partial crack) can be detected by comparing together the frequencies of the two signals in clockwise and counter clockwise directions for the same conductive segment 38*a*. In this case, a differential measurement is performed. For example, the two frequencies of signals in clockwise and counter clockwise directions are subtracted from one another, and the result (the difference) is checked with respect to a predefined range of expected values. In particular, if the difference is greater that a threshold, the two frequencies are deemed to be different from one another and a defect in the die 30 is detected.

A structural defect that affect only a portion of the conductive segment 38*a* increases locally the electrical resistance of the conductive segment 38*a* (the same applies to other conductive segments 38*b*-38*d*). A high-resistance in one portion only of the conductive segment 38*a* may reduce the frequency of the clockwise signal (such frequency being lower than the expected value). On the contrary, the frequency of the counter clockwise signal may be differently affected, or not affected at all. Therefore, by comparing the two frequencies together provides an indication of the presence, or absence, of a defect in the segment 38*a* under test. This method can be applied to the circuit topology herein, as well as to the circuit topologies of the known art.

Figure 7A:
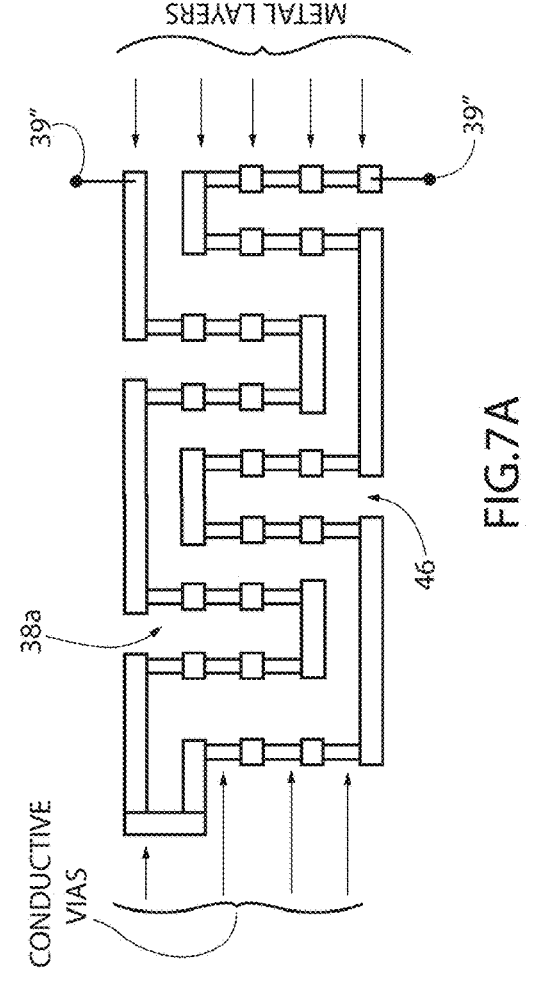
FIG. 7A is a schematic section view of a portion of the crack detector, according to an embodiment.

FIG. 7A shows a structural implementation of the conductive segment 38*a* (the other segments 38*b*-*d* being equivalent) and of the conductive line 46 connecting the second end 39" to the chain 45, when such conductive line 46 is formed at the periphery of the die 30, i.e., out of region 32*b* and, more in particular, between the seal ring 36 and the edge 32*a*. The conductive line 46 is formed through various metal layers, analogously to conductive segment 38*a*. In this case, in fact, the conductive segment 38*a*-38*d* and the respective conductive line 46 are formed as two interleaved metal and via serpentines, with the two ends 39' and 39" connected to the chain 45 or 45', as already shown in FIGS. 5 and 6.

Figure 8:
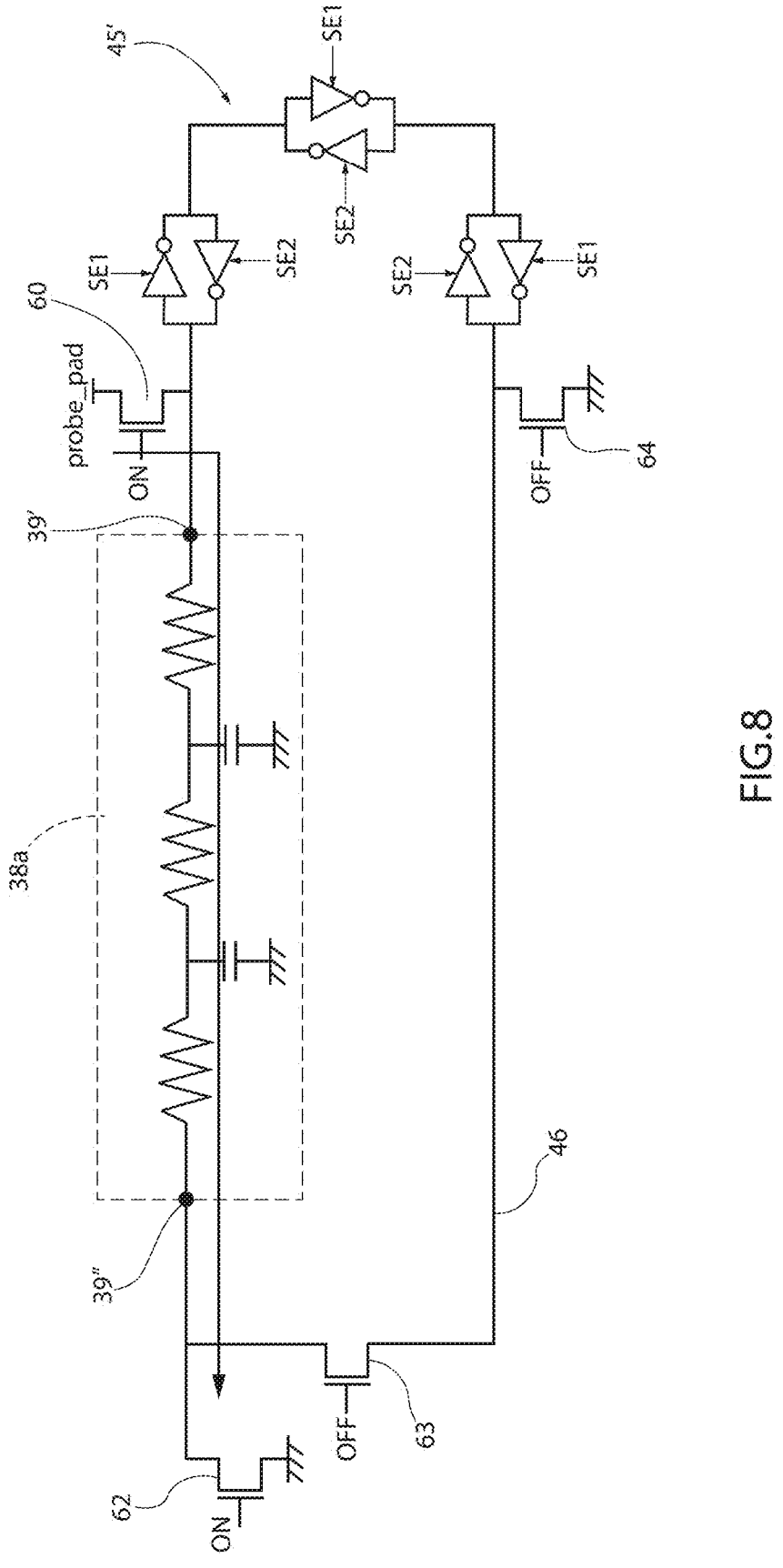
FIG. 8 shows an electrical representation of a portion of a crack detector to perform a resistive measurement, according to an embodiment.

In a further embodiment, FIG. 8, a defect can be detected by a resistance measurement. This can be done by applying a voltage through a probe and check the current from it, to calculate the resistance in a per se known way. All inverters 45*a*-45*f* of the bi-directional oscillating structure 45' are disabled (SE1=SE"="0") during this test.

A number of switches (represented as transistors) are coupled to the crack sensor in order to perform this test. In particular, a switch 60 connects the first end 39' to the probe pad, to supply a test current to first end 39'; a switch 62 connects the second end 39" to the ground; a switch 63 connects the second end 39" to the conductive line 46; and a switch 64 connects the conductive line 46 to the ground.

To perform a resistive test of conductive segment 38*a*, switches 60 and 62 are turned on, and switches 63 and 64 are turned off. A test current flows from the probe pad to the ground, passing through the conductive line 38. An electrical resistance of segment 38*a* can be measured in a known way, and compared with an expected value. A result of such comparison is indicative of an abnormal resistance in segment 38*a*, which may indicate the presence of a structural defect.

Alternatively, the electrical resistance of segment 38*a* can be measured and compared with the electrical resistance of another segment, for example segment 38*b*. In this case, a differential measurement is performed. For example, the two resistance values belonging to two respective conductive segments 38*a*, 38*b* are subtracted from one another, and the result (the difference) is checked with respect to a predefined range of expected values. In particular, if the difference is greater that a threshold, the two resistance values are deemed to be different from one another and a defect in the die 30 is detected.

Figure 9:
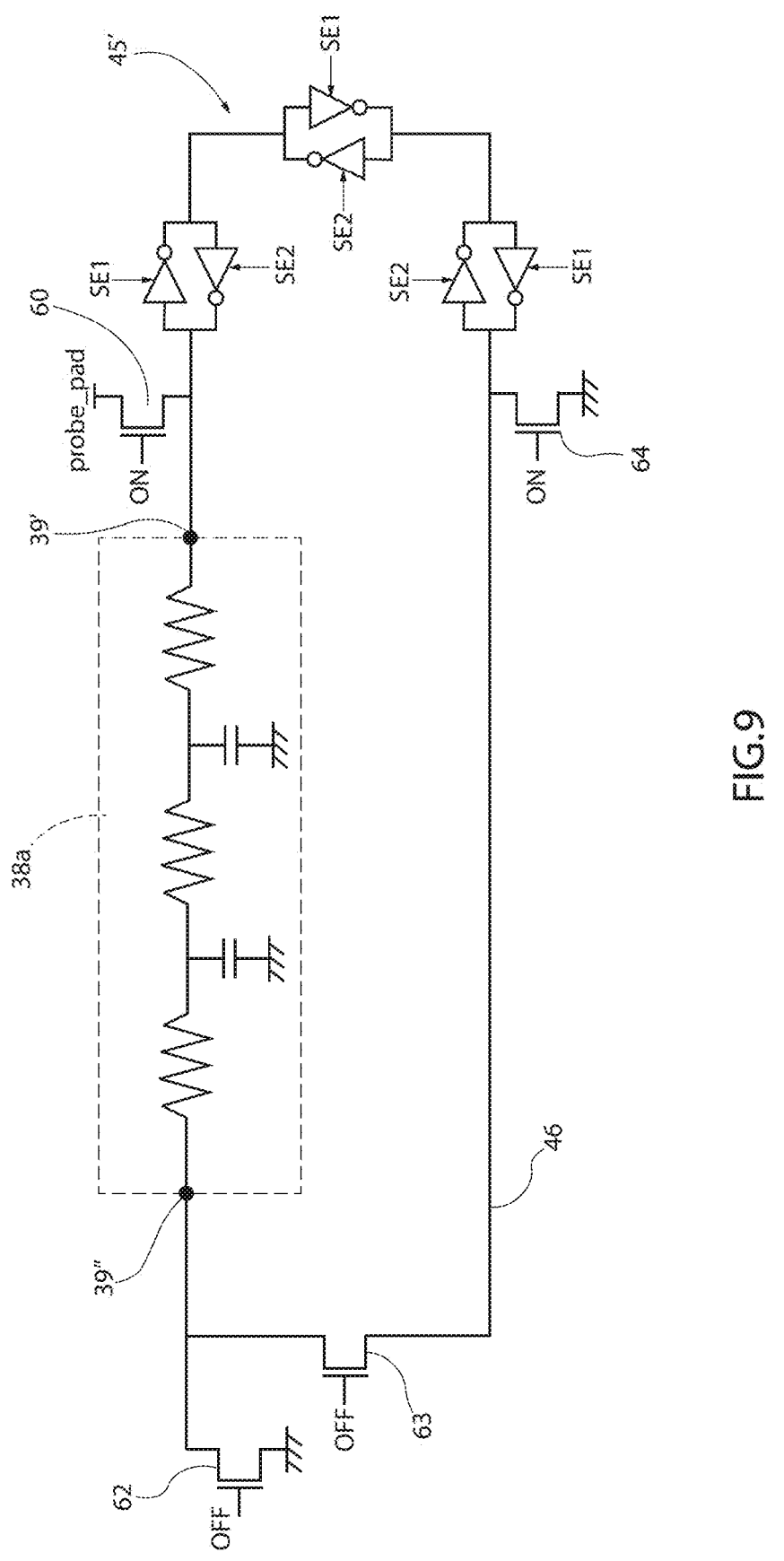
FIG. 9 shows an electrical representation of a portion of a crack detector to perform a leakage test, according to an embodiment.
Figure 10:
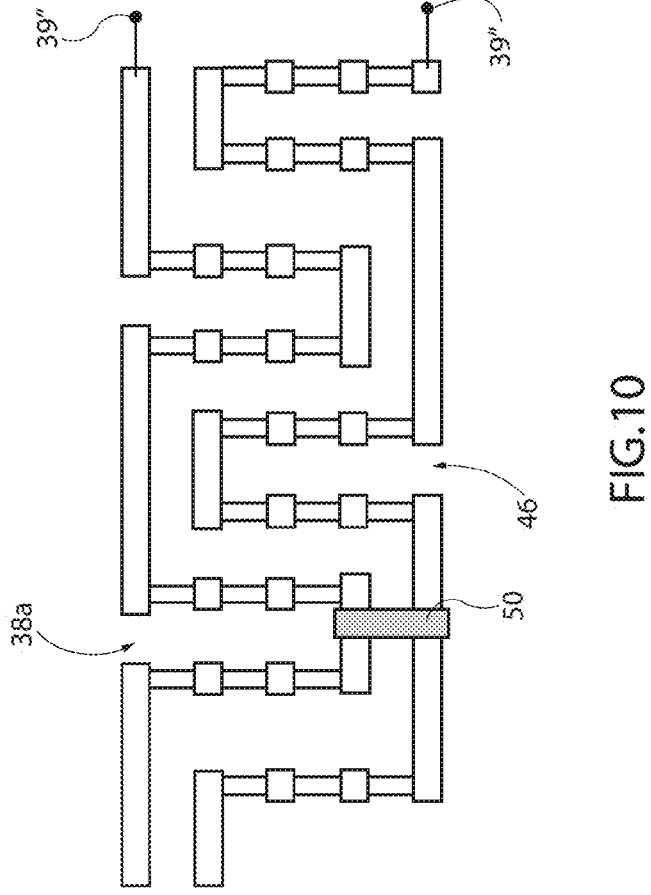
FIG. 10 is a section view corresponding to the view of FIG. 7A, where a defect causing current leakage is present, which can be detected by the crack sensor of FIG. 9.

In a further embodiment, FIG. 9, a leakage test can be carried out. To do so, a voltage is applied through a probe and the current from it is checked; ideally such current should be negligible. All inverters of the oscillating structure 45' are disabled, or not present, during this test, as in FIG. 8. During this test, switch 60 is on, to connect the first end 39' to the probe pad, for supplying the test current. It is noted that switch 64 is also turned on, to connect conductive line 46 to ground. All other switches 62 and 63 are turned off. This test can detect a short-circuit between the two serpentines (that of segment 38 and that of line 46), as exemplified in FIG. 10 by undesired connection 50. All other elements of FIG. 10 correspond to those of FIG. 7A, already discussed. In case a short-circuit is present, high current (above a certain threshold, pre-set) is detected by the probe and the defect is revealed.

Figure 11:
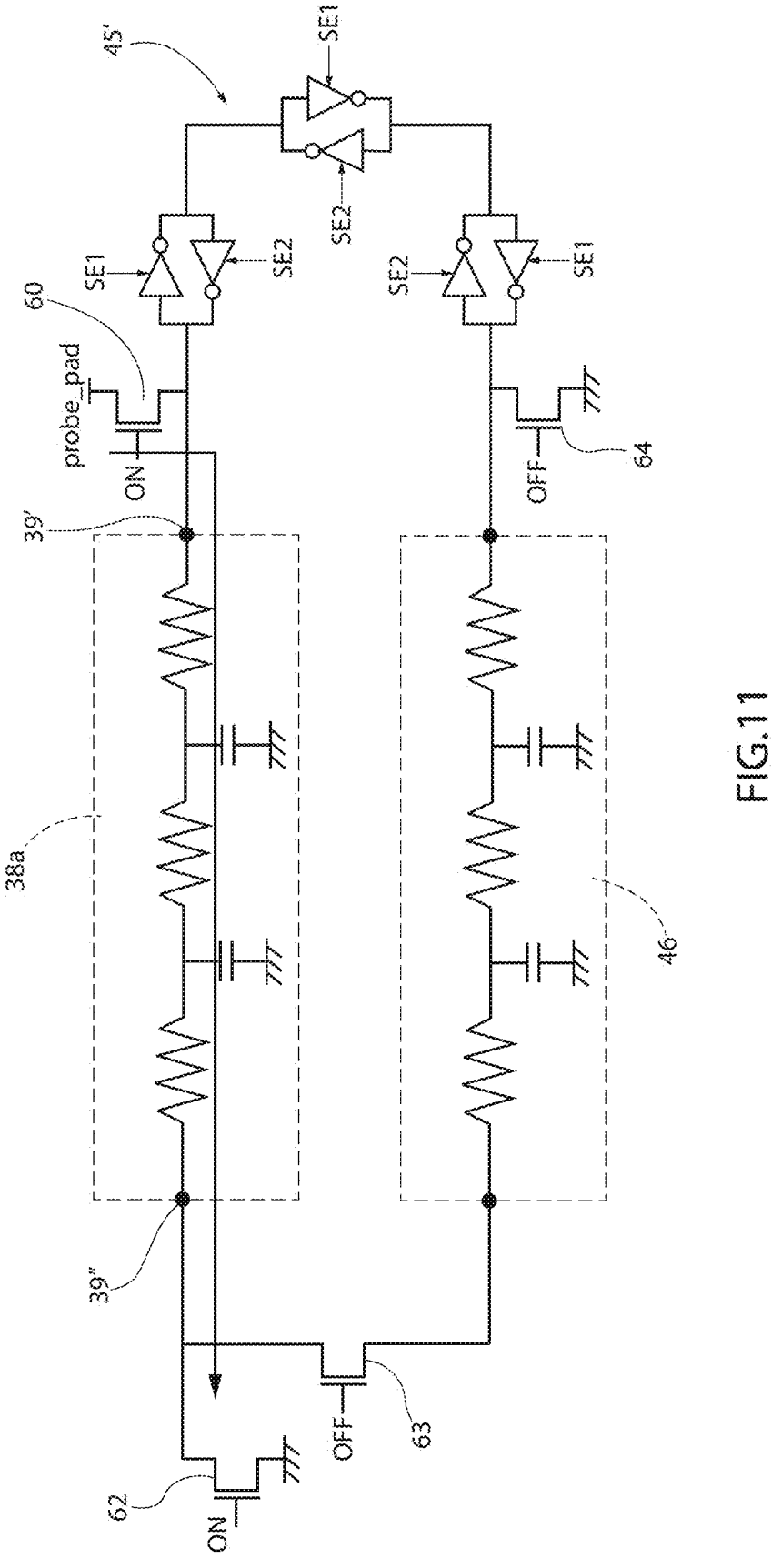
FIG. 11 shows an electrical representation of a portion of a crack detector to perform a resistive measurement, according to a further embodiment.

FIG. 11 shows a further embodiment. The embodiment of FIG. 11 is based on the embodiment of FIG. 8 (corresponding elements are identified with the same reference numerals and not further described). In FIG. 11, the conductive line 46 is designed and manufactured to be structurally and/or electrically equivalent or equal to the conductive segment 38*a* (as well as conductive segments 38*b*-38*d*). The conductive line 46 is, in the embodiment of FIG. 11, schematically depicted as a RC electrical structure. Even though FIG. 11 is based on FIG. 8, the proposed design of conductive line 46 applies equally to the embodiment of FIG. 9.

The advantages described previously, according to the various embodiments, emerge clearly from the foregoing description.

In particular, the provision of a multi sensor on a single chip, the sensor resistance conversion into a measurable frequency and the use of a dual serpentine interleaved sensor, provide (singularly or in combination) the following advantages: reduced test time, improved screening, possibility of differential screening (among the four sensors) on chip, provision of a first level of topographical fault localization, fine measure of the sensor resistance, improvement of the correlation capability required for acceptance limit capability tuning.

Finally, it is clear that modifications and variations may be made to what has been described and illustrated herein, without thereby departing from the scope described herein.

An assembly for detecting a structural defect in a semiconductor die (30), may be summarized as including a defect-detection sensor and a microcontroller (43), wherein the defect-detection sensor includes a plurality of resistive paths (38*a-d*) of electrical-conductive material in the semiconductor die (30), each of which has a first end (39') and a second end (39") and extends in a respective region of the semiconductor die proximate a perimeter (32*a*) of the semiconductor die, partially encircling an interior portion (32*b*) of the semiconductor die (30); and a plurality of signal-generation structures (45), each of which is electrically coupled to the first end (39') and the second end (39") of a respective resistive path (38*a-d*) and is configured to supply a respective test signal to the resistive path (38*a-d*); and wherein the microcontroller (43) is operatively coupled to the plurality of signal-generation structures (45), and are configured to control the signal-generation structures (45) to generate the test signals; acquire the test signals in each resistive paths (38*a-d*); test an electrical feature of the resistive paths (38*a-d*) by performing an analysis of the test signals acquired; and detect the presence of said structural defect in the semiconductor die (30) based on a result of said analysis of the test signals acquired.

Each resistive path (38*a-d*) may include a loop formed by a first sub-path extending from the first end (39') to an intermediate connection point and a second sub-path extending from the intermediate connection point to the second end (39").

The semiconductor die (30) may include a seal ring (36) encircling the interior portion (32*b*), each resistive path (38*a-d*) extending between the seal ring (36) and the perimeter (32*a*) with the exception of the first and the second ends (39'0, 39" that extend through the seal ring (36) towards the interior portion (32*b*).

Each signal-generation structure (45) may include a current generator that can be activated to supply the test signal, which is an electrical current, to the respective resistive path (38*a-d*); and the microcontroller (43) is configured to: control the signal-generation structures (45) by activating the current generator; and test the electrical feature of the resistive paths (38*a-d*) by measuring an electrical resistance value that each resistive path (38*a-d*) opposes to the flow of the electrical current.

The microcontroller (43) may be further configured to test the electrical feature of the resistive paths (38*a-d*) by performing a differential measurement of the electrical resistance values among said plurality of resistive paths (38*a-d*).

Said defect may be detected if a result of the differential measurement is out of a predefined range of expected values.

Each signal-generation structure (45) may include an oscillator device (45) including an odd number of inverters (45*a*-45*c*) connected in electrical series to one another between the first end (39') and the second end (39"), said oscillator device (45) forming, with the respective resistive path (38*a-d*) to which it is coupled, a mono-directional ring oscillator.

Each signal-generation structure (45) may include an oscillator device (45') including a first set of inverters (45*a*-45*c*) in odd number connected in electrical series to one another between the first end (39') and the second end (39"), and a second set of inverters (45*d*-45*f*) in odd number connected in electrical series to one another between the first end (39') and the second end (39") in antiparallel connection with respect to the first set of inverters (45*a*-45*c*), said oscillator device (45) forming, with the respective resistive path (38*a-d*) to which it is coupled, a bi-directional ring oscillator.

The test signal may be an oscillation signal having an oscillation frequency, the microcontroller (43) being configured to test the electrical feature of the resistive paths (38*a-d*) by performing an analysis of the oscillation frequency of the test signal belonging to the resistive path (38*a-d*) under test.

The microcontroller (43) may be configured to perform said analysis of the oscillation frequency by comparing the oscillation frequency of the test signal belonging to the resistive path (38*a-d*) under test with a frequency of another test signal belonging to another resistive path (38*a-d*) of the plurality of resistive paths (38*a*-38*d*).

The microcontroller (43) may be configured to perform said analysis of the oscillation frequency by performing a differential measurement the oscillation frequency of the test signal belonging to the resistive path (38*a-d*) under test with a frequency of another test signal belonging to another resistive path (38*a-d*) of the plurality of resistive paths (38*a*-38*d*).

Said defect may be detected if a result of the differential measurement is out of a predefined range of expected values.

The microcontroller (43) may be configured to perform said analysis of the oscillation frequency by comparing the oscillation frequency of the test signal belonging to the resistive path (38*a-d*) under test with an expected reference frequency.

The microcontroller (43) may be further configured to test one resistive path (38*a*-38*d*) by: activate the first set of inverters (45*a*-45*c*) coupled to said resistive path (38*a*-38*d*) under test, thus causing the generation of one respective test signal flowing in a first direction through the resistive path (38*a*-38*d*) under test and, at the same time, deactivate the second set of inverters (45*d*-45*f*) coupled in antiparallel connection to the activated first set of inverters (45*a*-45*c*) of said resistive path (38*a*-38*d*) under test; acquire a first frequency value of the test signal flowing in said first direction; deactivate the first set of inverters (45*a*-45*c*) coupled to the resistive path (38*a*-38*d*) under test, and, at the same time, activate the second set of inverters (45*d*-45*f*) coupled to the resistive path (38*a*-38*d*) under test, thus causing the generation of another test signal flowing in a second direction, opposed to the first direction, through the resistive path (38*a*-38*d*) under test; acquire a second frequency value of the test signal flowing in said second direction; compare the first frequency value with the second frequency value; and associate a physical state of the semiconductor die (30) to a result of said comparison of the first frequency value with the second frequency value.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An assembly for detecting a presence of a structural defect in a semiconductor die, comprising:
    a defect-detection sensor including:
        a plurality of first resistive paths of electrical-conductive material in the semiconductor die, each first resistive path of the plurality of resistive paths having a respective first end and a respective second end and each first resistive path of the plurality of first resistive paths extending in a respective region of the semiconductor die proximate a perimeter of the semiconductor die and partially encircling an interior portion of the semiconductor die; and a plurality of signal-generation stages in the semiconductor die, each signal-generation stage of the plurality of signal-generation stages is electrically coupled to the first end of a first respective resistive path of the plurality of first resistive paths and is configured to supply a respective test signal to the first respective resistive path;

a plurality of second resistive paths each coupled between a respective signal generation stage and a respective second end;

a plurality of switches each coupled between a respective second resistive path and the corresponding second end and configured to open during testing of the corresponding first resistive path; and a microcontroller in the semiconductor die and operatively coupled to the plurality of signal-generation stages and configured to:

control the plurality signal-generation stages to generate a plurality of test signals;

receive the plurality of test signals of the plurality of resistive paths;

test an electrical feature of the plurality of first resistive paths by performing an analysis on the plurality of test signals; and detect the presence of the structural defect in the semiconductor die based on a result of the analysis on the plurality of test signals.

2. The assembly of claim 1, wherein the semiconductor die includes:

a seal ring encircling the interior portion, each first resistive path of the plurality of first resistive paths extending between the seal ring and the perimeter, and the respective first and the second ends extending through the seal ring towards the interior portion.

3. The assembly of claim 1, wherein each signal-generation structure stage of the plurality signal-generation stages includes:

a current generator configured to be activated to supply the respective test signal that is an electrical current to the resistive path, wherein the microcontroller is configured to:

control the plurality of signal-generation stages by activating the current generator; and test an electrical feature of the resistive path of the plurality of first resistive paths by measuring an electrical resistance value by which the resistive path opposes to a flow of the electrical current.

4. The assembly of claim 3, wherein the microcontroller is configured to test the electrical feature of the first resistive path by performing a differential measurement of electrical resistance values of the plurality of first resistive paths.

5. The assembly of claim 4, wherein the structural defect is detected if a result of the differential measurement is outside a predefined range of expected values.

6. The assembly of claim 1, wherein each signal-generation stage includes:

an oscillator device including an odd number of inverters that are serially coupled between the respective first end and the respective second end, the oscillator device forming, with the respective first resistive path to which the oscillator device is coupled, a mono-directional ring oscillator.

7. The assembly of claim 1, wherein each signal-generation stage includes:

an oscillator device including:

a first set of inverters that are odd in number and that are serially connected to one another between the first end and the second end; and a second set of inverters that are odd in number and that are serially connected to one another between the first end and the second end in antiparallel connection with respect to the first set of inverters, wherein the oscillator device forms, with the respective first resistive path to which the oscillator device is coupled, a bi-directional ring oscillator.

8. The assembly of claim 6, wherein the test signal is an oscillation signal having an oscillation frequency, the microcontroller is configured to test the electrical feature of the plurality of first resistive paths by performing an analysis on the oscillation frequency of the test signal of the resistive path under test.

9. The assembly of claim 8, wherein the microcontroller is configured to:

perform the analysis on the oscillation frequency by comparing the oscillation frequency of the test signal of the first resistive path under test with a frequency of another test signal of another resistive path of the plurality of first resistive paths.

10. The assembly of claim 8, wherein the microcontroller is configured to:

perform the analysis on the oscillation frequency by performing a differential measurement of the oscillation frequency of the test signal belonging to the first resistive path under test with a frequency of another test signal belonging to another first resistive path of the plurality of first resistive paths.

11. The assembly of claim 10, wherein the structural defect is detected if a result of the differential measurement is outside a predefined range of expected values.

12. The assembly of claim 8, wherein the microcontroller is configured to:

perform the analysis on the oscillation frequency by comparing the oscillation frequency of the test signal belonging to the first resistive path under test with an expected reference frequency.

13. The assembly of claim 7, wherein the microcontroller is configured to test one first resistive path by:

activating the first set of inverters coupled to the resistive path under test to cause one respective test signal to be generated and to flow in a first direction through the first resistive path under test;

deactivating the second set of inverters coupled in antiparallel connection to the activated first set of inverters of the resistive path under test;

receiving a first frequency value of the test signal flowing in the first direction;

deactivating the first set of inverters coupled to the resistive path under test;

activating the second set of inverters coupled to the resistive path under test to cause another test signal to be generated and flow in a second direction, opposite to the first direction, through the resistive path under test;

receiving a second frequency value of the test signal flowing in the second direction;

comparing the first frequency value with the second frequency value; and associating a physical state of the semiconductor die to a result of comparing the first frequency value with the second frequency value.

14. A method for detecting a presence of a structural defect in a semiconductor die, comprising:

supplying, by each signal-generation stage of a plurality of signal-generation stages in the semiconductor die, a respective test signal of a plurality of test signals to a respective first resistive path of a plurality of first resistive paths, each signal-generation stage of the plurality of signal-generation stages being electrically coupled to a first end and a second end of the first resistive path;

controlling, with a microcontroller in the semiconductor die, the plurality signal-generation stages to generate the plurality of test signals;

testing, with the microcontroller, an electrical feature of the plurality of first resistive paths by performing an analysis on the plurality of test signals; and detecting, with the microcontroller the presence of the structural defect in the semiconductor die based on a result of the analysis on the plurality of test signals, wherein the semiconductor die includes a plurality of second resistive paths each coupled between a respective signal generation stage and a respective second end, wherein the semiconductor die includes a plurality of switches each coupled between a respective second resistive path and the corresponding second end and configured to open during testing of the corresponding first resistive path.

15. The method of claim 14, wherein each resistive path of the plurality of first resistive paths includes a loop formed by a first sub-path extending from the respective first end to an intermediate connection point and a second sub-path extending from the intermediate connection point to the respective second end.

16. The method of claim 14, wherein the semiconductor die includes a seal ring encircling an interior portion of the semiconductor die, each first resistive path of the plurality of first resistive paths extending between the seal ring and a perimeter of the semiconductor die, and the respective first and the second ends extending through the seal ring towards the interior portion.

17. The method of claim 14, comprising:

supplying, by a current generator, the respective test signal that is an electrical current to the resistive path;

controlling the plurality of signal-generation stages by activating the current generator; and testing an electrical feature of the first resistive path of the plurality of first resistive paths by measuring an electrical resistance value by which the first resistive path opposes to a flow of the electrical current.

18. The method of claim 17, comprising:

testing the electrical feature of the resistive path by performing a differential measurement of electrical resistance values of the plurality of first resistive paths.

19. The method of claim 18, comprising:

detecting the structural defect in response to a result of the differential measurement being outside a predefined range of expected values.

\* \* \* \* \*